(12) United States Patent
Herner (10) Patent No.: US 11,133,439 B1
(45) Date of Patent: Sep. 28, 2021

(54) LIGHT EMITTING DEVICE WITH REFLECTOR

(71) Applicant: Black Peak LLC, Boulder, CO (US)

(72) Inventor: Scott Brad Herner, Portland, OR (US)

(73) Assignee: Black Peak LLC, Boulder, CO (US)

( * ) Notice: Subject to any disclaimer, the term of this patent is extended or adjusted under 35 U.S.C. 154(b) by 10 days.

(21) Appl. No.: 16/865,386

(22) Filed: May 3, 2020

(51) Int. Cl.
| | |
|---|---|
| *H01L 33/46* | (2010.01) |
| *H01L 33/50* | (2010.01) |
| *H01L 25/065* | (2006.01) |
| *H01L 27/15* | (2006.01) |
| *H01L 33/30* | (2010.01) |

(52) U.S. Cl.
CPC .......... *H01L 33/46* (2013.01); *H01L 25/0655* (2013.01); *H01L 27/15* (2013.01); *H01L 33/30* (2013.01); *H01L 33/502* (2013.01); *H01L 33/505* (2013.01); *H01L 2933/0025* (2013.01); *H01L 2933/0041* (2013.01)

(58) Field of Classification Search
CPC ......... H01L 33/46; H01L 33/30; H01L 27/15; H01L 25/0655; H01L 33/502; H01L 33/505; H01L 2933/0025; H01L 2933/0041
USPC .......................................................... 257/89
See application file for complete search history.

(56) References Cited

U.S. PATENT DOCUMENTS

| | | | |
|---|---|---|---|
| 6,320,891 B1* | 11/2001 | Seko | B82Y 20/00 372/50.21 |
| 10,388,641 B2 | 8/2019 | Martin | |
| 2006/0208273 A1* | 9/2006 | Kang | H01L 33/08 257/103 |
| 2017/0294417 A1* | 10/2017 | Edmond | H01L 25/0753 |
| 2018/0226543 A1 | 7/2018 | Masui et al. | |
| 2019/0088820 A1* | 3/2019 | Danesh | H01L 33/32 |
| 2019/0305192 A1* | 10/2019 | Han | H01L 25/13 |
| 2019/0355702 A1* | 11/2019 | Hemer | H01L 29/45 |
| 2020/0044125 A1* | 2/2020 | Chen | H01L 33/505 |
| 2020/0303676 A1* | 9/2020 | Lin | H01L 27/322 |

OTHER PUBLICATIONS

U.S. Appl. No. 16/671,075 "Area efficient subpixel apparatus" S.B. Herner.
U.S. Appl. No. 16/835,614 "Light emitting device with small footprint" S.B. Herner.

* cited by examiner

*Primary Examiner* — Duy T Nguyen
(74) *Attorney, Agent, or Firm* — Scott Brad Herner (57) ABSTRACT

This application describes a light emitting device or an assembly of light emitting devices. In the completed light emitting device, a distributed Bragg reflector minimizes the possibility of disturbing adjacent light emitting devices. Methods to fabricate such devices and assemblies of devices are also described.

13 Claims, 7 Drawing Sheets

LIGHT EMITTING DEVICE WITH REFLECTOR

FIELD

The embodiments of the invention are directed generally to small light emitting devices, and especially to small light emitting devices arranged in an array, where the light emitting devices have a high density. The light emitting device comprises a light emitting diode (LED) and a distributed Bragg reflector (DBR).

CROSS REFERENCE TO RELATED APPLICATIONS

The present application is related to (i) U.S. patent application ("Non-provisional application I"), Ser. No. 16/671,075, entitled "Area-efficient subpixel apparatus," filed Oct. 31, 2019 and (ii) U.S. patent application ("Non-provisional application II"), Ser. No. 16/835,614, entitled "Light emitting device with small footprint," filed Mar. 31, 2020. The disclosures of Non-Provisional Applications I and II (collectively, the "Non-Provisional Applications") are hereby incorporated by reference in their entireties.

BACKGROUND

As light emitting devices with wavelength-converting layers (W-CLs) are packed more closely together in arrays, greater care must be taken to avoid light from one light emitting device disturbing an adjacent light emitting device. Light emitting devices that have both an LED and an W-CL, wherein the W-CL absorbs light of one dominant wavelength from the LED and re-emits light with a different dominant wavelength are especially susceptible to disturbance. For example, light emission from one light emitting device may stimulate emission from an adjacent light emitting device's W-CL.

The need to minimize disturbances amongst an array of light emitting devices increases as the pitch of light emitting devices decreases. The light intensity from a light emitting device increases as the distance to the device decreases. Pitch is the center-to-center distance between adjacent devices. Pitch is related to the size of the light emitting devices, when viewed top down, and the unoccupied space between adjacent light emitting devices. Existing applications for small displays using an array of light emitting devices include watches and virtual reality headsets. New applications of small displays include direct projection of images into the human retina from contact lenses. Many of these applications require small light emitting devices arranged in a two dimensional array with small pitch. When light emitting devices with small size, such as those described in the Non-Provisional applications, are arranged with a small pitch, minimization of disturb is important to maintain image quality.

Reflector layers are useful in light emitting devices to direct light to its most useful direction and improve the luminous efficiency of the device. Reflector layers can also help minimize disturbs between devices. DBRs are particularly useful as reflectors in light emitting devices as their composition may be optimized to reflect light of a particular wavelength or wavelengths, have a high reflectivity of visible light, and are composed of dielectric materials that adhere well to other dielectric materials such as silicon oxide. In contrast, silver, which has excellent reflectivity to visible light, has poor adhesion to dielectric materials such as silicon oxide.

SUMMARY

The present invention provides a method to form a light emitting device. The method provides an improved reflector to minimize the disturb of one light emitting device by an adjacent light emitting device. The method comprises the steps of providing an LED having an LED top surface, an LED bottom surface, and a plurality of LED sidewalls. The plurality of LED sidewalls are substantially orthogonal to the LED top surface and LED bottom surface. Each LED sidewall of the plurality is contiguous with at least the LED top surface or the LED bottom surface, or both. A dielectric layer coats the LED sidewalls. A trench is formed in the dielectric layer. The trench has trench sidewalls and a trench bottom. The trench sidewalls are substantially parallel to the plurality of LED sidewalls. A DBR is formed in the trench of the dielectric layer. The DBR comprises layers that conformally coat the trench sidewalls and trench bottom.

Another embodiment of the present invention provides a light emitting device. The light emitting device has an LED, wherein the LED has an LED top surface, an LED bottom surface, and LED sidewalls. The LED sidewalls are orthogonal to the LED top surface and LED bottom surface, and each LED sidewall is contiguous with either the LED top or bottom surface, or both. The light emitting device has a DBR with a DBR first surface and a DBR second surface. The DBR first and second surfaces are substantially parallel to the LED sidewalls. A dielectric layer is between the LED and the DBR.

Another embodiment of the present invention provides an assembly of light emitting devices with a plurality of light emitting devices. Each light emitting device of the plurality has an LED, wherein the LED has an LED top surface, an LED bottom surface, and a plurality of LED sidewalls. The LED sidewalls are orthogonal to the LED top and bottom surfaces, and each LED sidewall is contiguous with either the LED top surface or LED bottom surface, or both. Each light emitting device of the plurality has a DBR with a DBR first surface and a DBR second surface. The DBR first surface and DBR second surface are substantially parallel to the LED sidewalls. A dielectric layer is between the LED and the DBR. The assembly of light emitting devices has a plurality of W-CLs, with at least a first W-CL and a second W-CL.

BRIEF DESCRIPTION OF THE DRAWINGS

The drawings are idealized representations to describe embodiments of the present disclosure and are not meant to be actual views of any particular component, structure, or device. The drawings are not to scale, and the thickness and dimensions of some layers may be exaggerated for clarity. Variations from the shapes of the illustrations are to be expected. For example, a region illustrated as a box shape may typically have rough and/or nonlinear features. Sharp angles that are illustrated may be rounded. Like numerals refer to like components throughout. The features, aspects, and advantages of the embodiments described herein will become better understood with regard to the following description, appended claims, and accompanying drawings, where:

DETAILED DESCRIPTION OF EMBODIMENTS

The present invention decreases disturb from adjacent light emitting devices, such as those disclosed those disclosed in the Non-Provisional applications referenced above. The present invention improves, for example, the light emitting device and the method of fabrication thereof, that are disclosed in Non Provisional Application I, in conjunction with FIGS. 3-8 and 20 therein, and Non Provisional Application II, in conjunction with FIGS. 6, 7, and 10-12 therein.

Figure 1A:
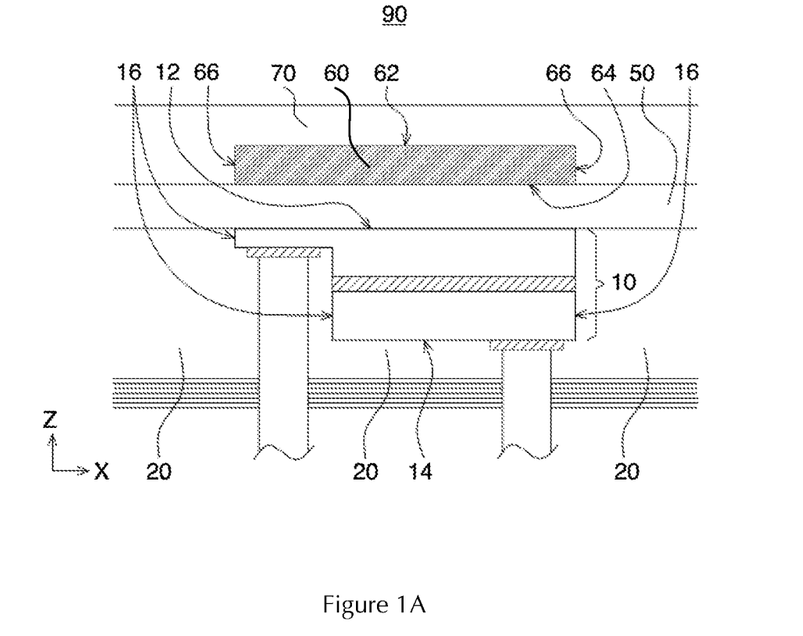
FIGS. 1A-1D schematically illustrates an embodiment of a method to form a light emitting device with an LED, a DRB, and a W-CL.

FIG. 1A is the initial step in forming the light emitting device, in accordance with one embodiment of the present invention. The elements and methods of fabrication shown in FIG. 1A have been disclosed in Non Provisional Application II and are summarized here. FIG. 1A is a cross-sectional view of a partially formed light emitting device 90 according to the present application, having an LED 10 with an LED top surface 12, an LED bottom surface 14, and a plurality of LED sidewalls 16. LED sidewalls 16 are substantially orthogonal to LED top surface 12 and LED bottom surface 14. Each LED sidewall 16 is contiguous with at least the LED top surface 12 or the LED bottom surface 14, or both. A dielectric layer 20 contacts LED sidewalls 16 and LED bottom surface 14. Another dielectric layer 50 overlies LED 10. A wavelength-converting layer (W-CL) 60 overlies LED 10. W-CL 60 has an W-CL top surface 62, an W-CL bottom surface 64, and W-CL sidewalls 66. Another dielectric layer 70 overlies W-CL 60.

W-CL 60 will absorb light emitted by LED 10, and will re emit light of a different wavelength. If W-CL 60 absorbs most of the light from LED 10, light emitted by light emitting device 90 will be dominated by light emitted by W-CL 60.

LED 10 is comprised of inorganic materials. LED 10 may comprise gallium nitride, indium gallium nitride, indium arsenide, aluminum gallium arsenide, gallium arsenide, gallium phosphide, gallium arsenide phosphide, aluminum indium gallium phosphide, gallium arsenide nitride, aluminum indium arsenide, aluminum antimonide, indium phosphide, indium antimonide, or indium gallium arsenide phosphide, and combinations thereof. Dielectric layers 20, 50, and 70 may be any suitable material that is sufficiently insulating and transparent to light of the dominant wavelength emitted by LED 10 and W-CL 60, including but not limited to silicon oxide, silicon nitride, aluminum oxide, and titanium oxide, or combinations thereof.

As disclosed in Nonprovisional Application I, the W-CL 60 may comprise an organic material, for example silicone, epoxy, or polycarbonate, combined with inorganic phosphor particles such as GaAlN, with the GaAlN phosphor particles excited by light with a dominant wavelength of between 420 and 470 nm (blue) and emitting light with a dominant wavelength of between 500 and 550 nm (red). In a different embodiment, the phosphor particles may be CaAlSiN:Eu, with CaAlSiN:Eu phosphor particles excited by light with a dominant wavelength of between 420 and 470 nm (blue), and emitting light with a dominant wavelength of between 610 and 730 nm (green). Any suitable phosphor particle may be used. In another embodiment, silicone, epoxy, or polycarbonate may be combined with quantum dots. The quantum dots may be any suitable nano-scale semiconductor material, for example group II-VI material having a composition ZnCdMgSe, CdSe, InP, ZnS, $K_2SiF_6$:Mn, $SrLi_3Al_3N_4$:Eu, or $CsPbBr_3$. In one embodiment, the composition of the quantum dots can be optimized to emit red (500 to 550 nm) or green (610 to 730 nm) light when excited by blue light (420 to 470 nm). In one embodiment, W-CL 60 may be screen printed into any suitable pattern over LED 10. Quantum dots are preferred over phosphor particles as quantum dots are smaller than phosphor particles, and can therefore be more easily patterned into smaller feature sizes. In a different embodiment, W-CL 60 may be phosphor particles or quantum dots embedded in glass, a technique known as phosphor-in-glass (PiG) or quantum dot-in-glass (QDiG).

In another embodiment, W-CL 60 may comprise multiple quantum wells (MQWs). Quantum wells are two dimensional films of inorganic semiconductors, and comprise pairs of alternating films of different materials, for example, ZnCdSe/ZnSe, ZnCdSe/ZnCdMgSe, InGaN/GaN, AlGaNInP/GaNInP, or any suitable pairing. In one example, GaInN/GaN MQWs in W-CL 60 absorb blue light from LED 10 and emit green light. In another example, AlGaNInP/GaNInP MQWs in W-CL 60 absorb blue light from LED 10 and emit red light.

Figure 1B:
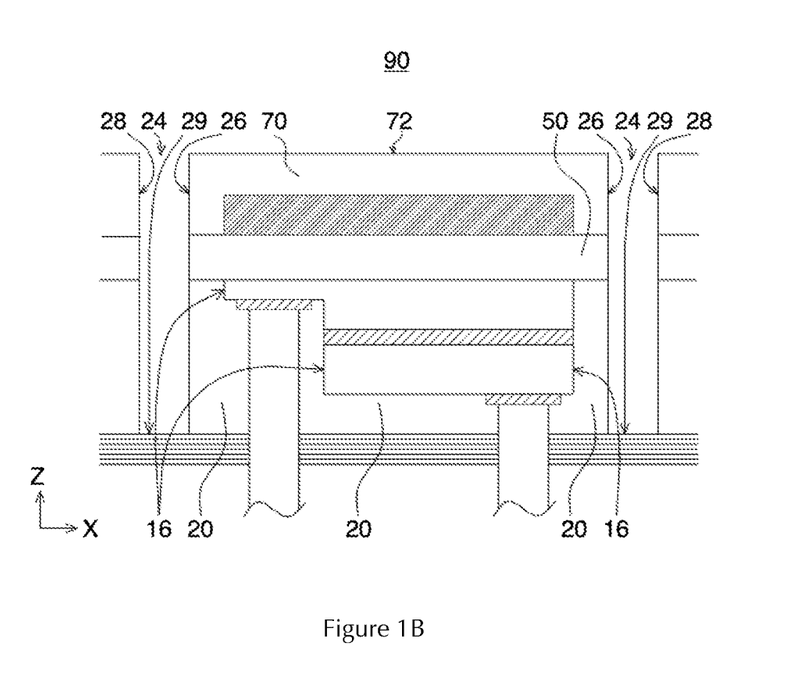

FIG. 1B shows the next step in formation of the light emitting device 90. A masking layer (not shown) is deposited on surface 72 of dielectric layer 70 and patterned. A trench 24 is etched in dielectric layers 70, 50, and 20. Any suitable technique may be used to etch the trench or trenches, such as corrosive gas or acid etch. After etching, the masking layer is removed (not shown), leaving trench 24. Trench 24 has inner trench sidewall 26, outer trench sidewall 28, and trench bottom 29. Inner and outer trench sidewall 26 and 28, respectively, are substantially parallel to LED sidewalls 16.

Figure 1C:
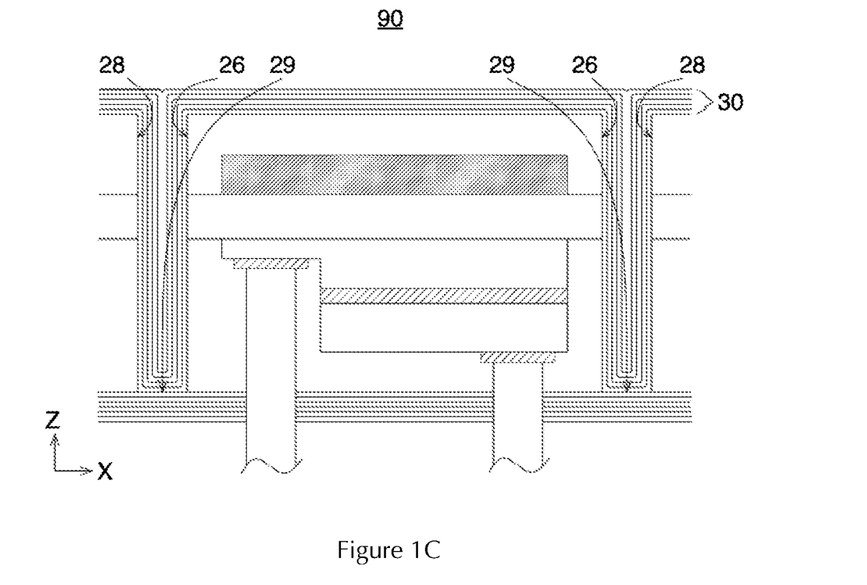

FIG. 1C shows the next step in formation of the light emitting device 90. First DBR 30 is deposited in trench 24. First DBR 30 comprises a plurality of layers in the form of one or more pairs of dielectric layers. Each dielectric layer in a pair has a different index of refraction. The plurality of dielectric layers of first DBR 30 may be deposited by any suitable method which conformally coats trench sidewalls 26 and 28 and trench bottom 29. Chemical vapor deposition (CVD) or atomic layer deposition (ALD), which is a type of CVD, are examples of conformal deposition techniques. The thickness of each dielectric layer in first DBR 30 is designed to be about one quarter of the wavelength of light that is to be reflected. The wavelength of light reflected varies with the index of refraction of each material. For example, for blue light with a wavelength from 440 to 460 nm, a suitably reflective first DBR 30 would be comprised of multiple pairs of aluminum oxide (index of refraction is 1.5 to 1.7) and titanium oxide (index of refraction is 2.3 to 2.7) layers, where the aluminum oxide layer is 67 t 7 nm thick and the titanium oxide layer is 49 t 5 nm thick.

First DBR 30 may comprise more than one pair of different materials in order to reflect light of more than one wavelength. First DBR 30 may comprise layers of different thickness to reflect light of different wavelengths. For example, first DBR 30 may comprise alternating pairs of aluminum oxide and titanium oxide to reflect blue light, and alternating pairs of silicon oxide and titanium oxide to reflect green light. First DBR 30 may be optimized to reflect two dominant wavelengths of light, which is useful for light emitting devices that comprise both an LED and W-CL, where the LED and W-CL emit light with different dominant wavelengths. First DBR 30 may comprise silicon oxide, silicon nitride, aluminum oxide, tantalum oxide, niobium oxide, titanium oxide, or any other suitable dielectric material. Deposition of one pair of layers, for example, a layer of silicon oxide and a layer of titanium oxide, will result in the pair of layers being deposited on both inner trench sidewall 26, outer trench sidewall 28, and trench bottom 29. Light that is normally incident on inner trench sidewall 26 can be reflected by both the pair of layers on inner trench sidewall 26 and the pair on outer trench sidewall 28. More layers can be deposited into the trench, and the final DBR may have 4, 8, 64, or more layers. In general, more layers will result in increased reflectivity.

Figure 1D:
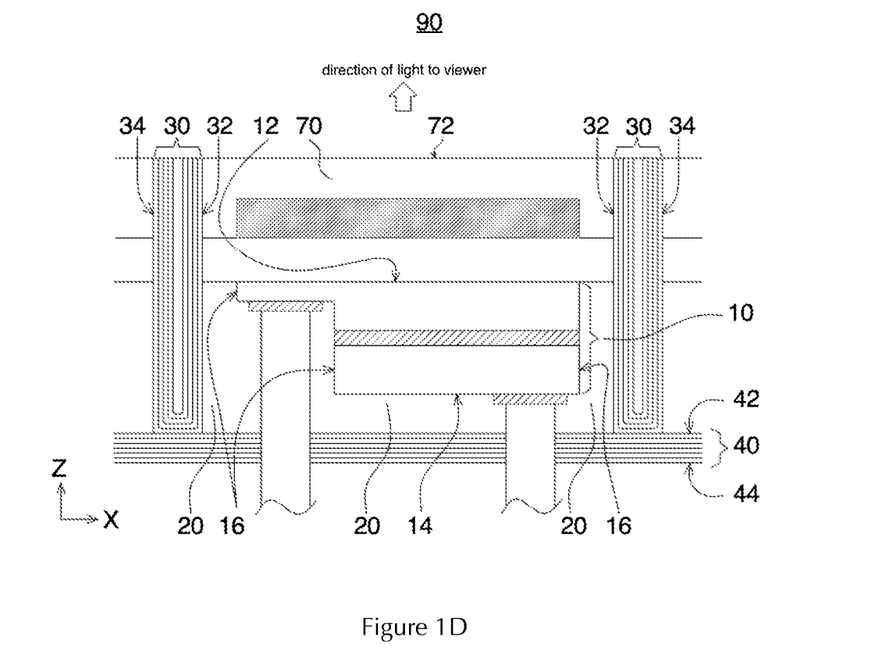

FIG. 1D shows the next step in formation of light emitting device 90. Layers of first DBR 30 that were deposited on surface 72 of dielectric layer 70 are removed by any suitable method, such as etch-back or chemo-mechanical planarization (CMP). First DBR 30 has a first DBR first surface 32 and a first DBR second surface 34. A second DBR 40 may underlie LED 10. Second DBR 40 has second DBR first surface 42 and second DBR second surface 44. Second DBR first surface 42 and second DBR second surface are substantially parallel to LED bottom surface 14. Fabrication of the light emitting device 90 is now substantially complete.

Summarizing, FIG. 1D shows a light emitting device 90 with an LED 10. LED 10 has an LED top surface 12, an LED bottom surface 14, and a plurality of LED sidewalls 16. The plurality of LED sidewalls 16 are substantially orthogonal to the LED top surface 12 and LED bottom surface 14. Each LED sidewall 16 is contiguous to either LED top surface 12 or LED bottom surface 14, or both. A first DBR 30 has a first DBR first surface 32 and a first DBR second surface 34. First DBR first and second surfaces 32 and 34, respectively, are substantially parallel to the plurality of LED sidewalls 16. Dielectric layer 20 is disposed between LED 10 and first DBR 30.

Summarizing, a method to form a light emitting device has been described. As described with FIG. 1A, the method comprises the steps of providing an LED 10 having an LED top surface 12, an LED bottom surface 14, and a plurality of LED sidewalls 16, wherein the plurality of LED sidewalls is substantially orthogonal to the LED top surface 12 and LED bottom surface 14, and wherein each LED sidewall of the plurality is contiguous with at least the LED top surface 12 or the LED bottom surface 14. A dielectric layer 20 coats the plurality of LED sidewalls 16. As shown in FIG. 1B, a trench 24 is formed in dielectric layer 20 as well as dielectric layers 50 and 70. Trench 24 has inner trench sidewall 26 and outer trench sidewall 28 that are substantially parallel to the plurality of LED sidewalls 16. Trench 24 also has trench bottom 29. As shown in FIG. 1C, a first DBR 30 comprising a plurality of layers, is formed in trench 24. The plurality of layers in the DBR conformally coat trench sidewalls 26 and 28 and trench bottom 29.

Figure 2:
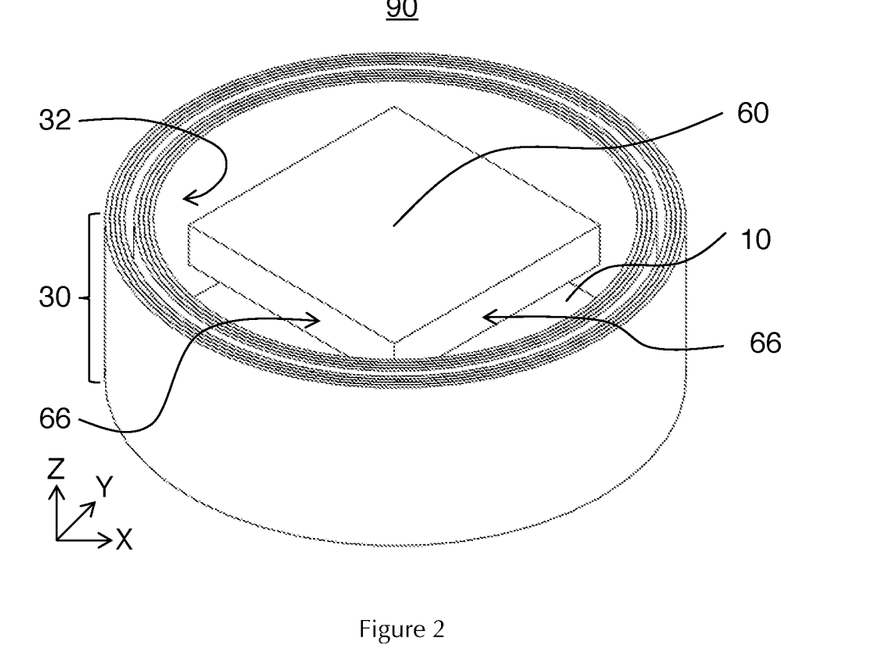
FIG. 2 schematically illustrates an isometric view of the light emitting device from FIG. 1, showing an example of a cylindrical-shaped DBR.

FIG. 2 is an isometric schematic of completed light emitting device 90. First DBR first surface 32 forms a cylinder in that surrounds the LED sidewalls (not visible) of LED 10 and W-CL sidewalls 66 of W-CL 60. A cylinder shape may be advantageous in directing more light towards the viewer, as shown in FIG. 1D, with fewer reflections before the light reaches the viewer, compared with a DBR with flat surface areas that will be subsequently described.

Figure 3:
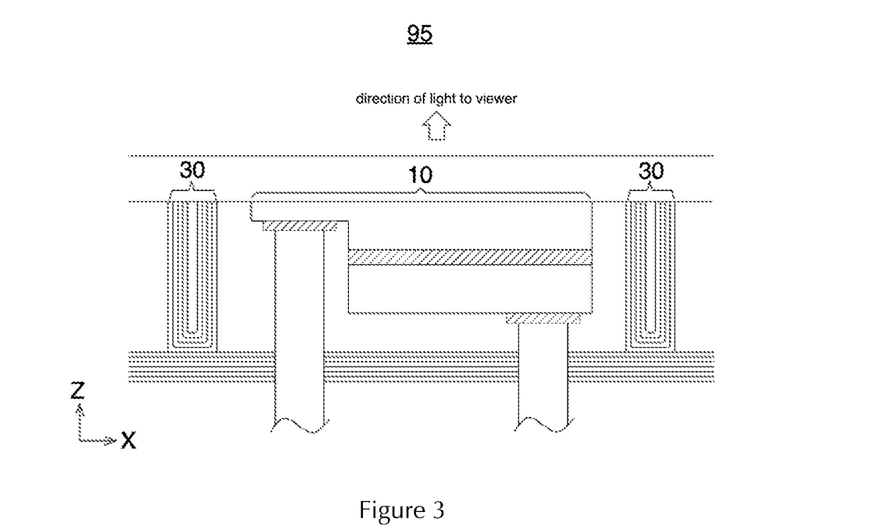
FIG. 3 schematically illustrates a cross-section schematic of an embodiment of a light emitting device without a W-CL.

FIG. 3 is a schematic cross-section of another embodiment of a light emitting device 95, in which there is no W-CL to emit light, with only LED 10 emitting light to the viewer. First DBR 30 is parallel to LED sidewalls 16.

Figure 4:
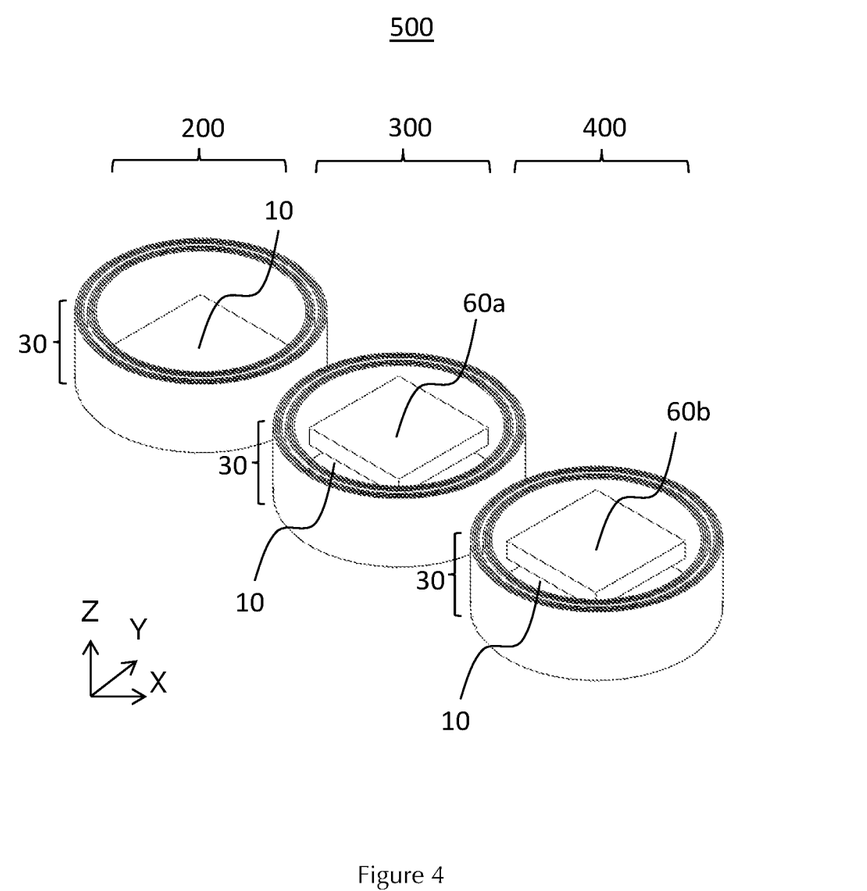
FIG. 4 schematically illustrates an isometric view of an embodiment of an assembly of light emitting devices, with a cylindrically-shaped DBR surrounding each LED of each light emitting device.

FIG. 4 is an isometric schematic of an embodiment of an assembly of light emitting devices 500, comprising light emitting devices 200, 300, and 400. Each light emitting device comprises a DBR 30 that is cylinder-shaped. Light emitting device 200 is shown in cross-sectional schematic in FIG. 3 and has been described previously, while light emitting devices 300 and 400 are shown in cross-sectional schematic in FIG. 1D, and have also been described previously. Light emitting devices 300 and 400 have W-CLs 60a and 60b, respectively, while light emitting device 200 does not have a W-CL. For example, if LED 10 in each of the light emitting devices 200, 300, and 400 emits blue light with a dominant wavelength of between 440 and 460 nm, and W-CL 60a emits green light with a dominant wavelength between 500 and 550 nm after absorbing blue light from LED 10, and W-CL 60b emits red light with a dominant wavelength between 500 and 550 nm, then assembly 500 can act as a pixel that can emit light of any color by combining light from each device in varying intensities. The assembly of light emitting devices may comprise any suitable number of light emitting devices. The assembly of light emitting devices may comprise 3, 6, 1,000, 100,000, or more light emitting devices.

Figure 5A:
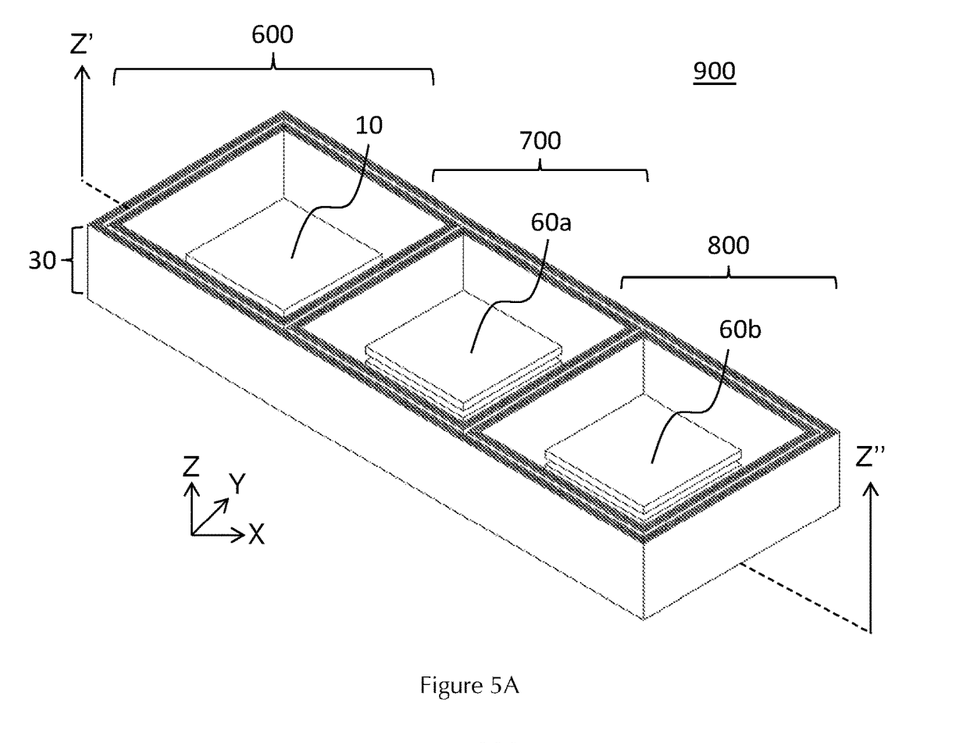
FIG. 5A schematically illustrates an isometric view of an embodiment of an assembly of light emitting devices, with a square-shaped DBR surrounding each LED of each light emitting device.
Figure 5B:
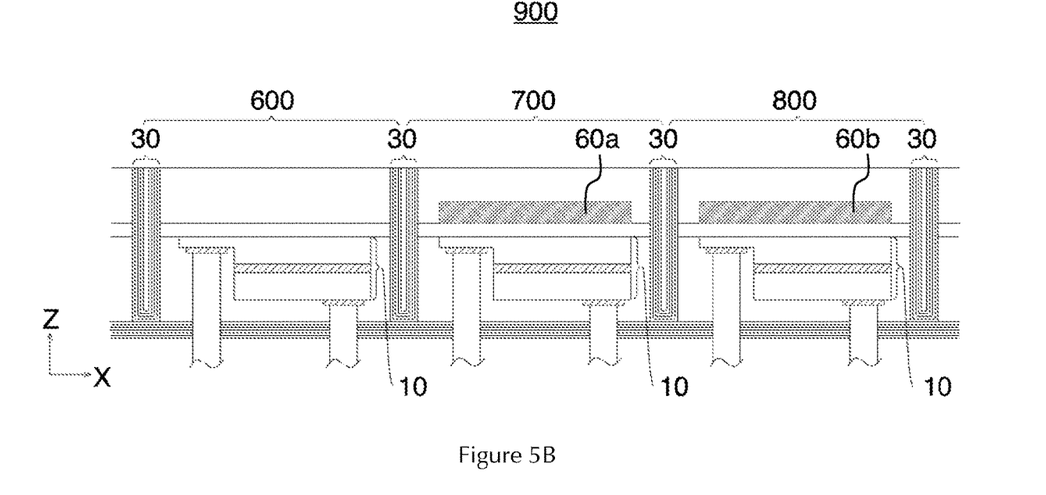
FIG. 5B schematically illustrates the Z'-Z" cross-section of the assembly of light emitting devices shown in FIG. 5A.

FIG. 5A is an isometric schematic of an embodiment of an assembly of light emitting devices 900. Each light emitting device comprises a DBR 30 that is square-shaped. FIG. 5B is a cross-section Z'-Z" of assembly 900 in FIG. 5A showing light emitting devices 600, 700, and 800. Similar to the embodiment shown in FIG. 4, the assembly embodiment shown in FIG. 5 is capable of emitting light of any color. Each light emitting device has an LED 10, and light emitting devices 700 and 800 each have W-CLs 60a and 60b, respectively. DBR 30 minimizes light from, for example, light emitting device 700 from stimulating emission from light emitting device 800.

Figure 5C:
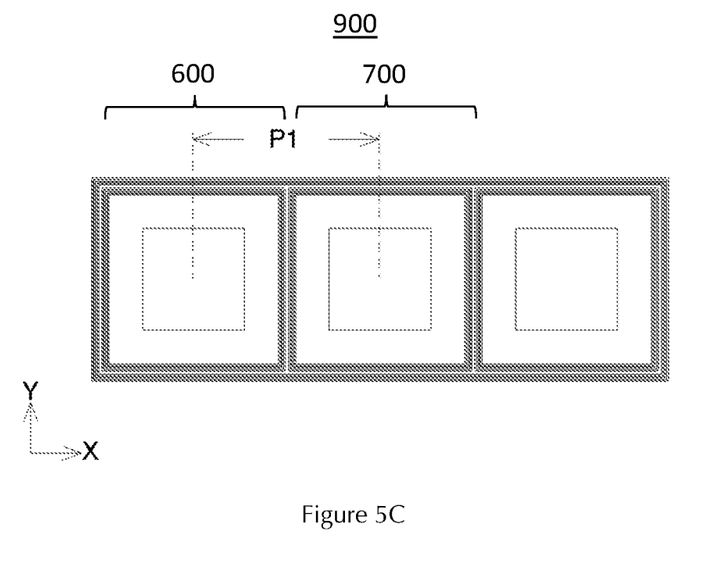
FIG. 5C schematically illustrates a plan view of the assembly of light emitting devices shown in FIG. 5A.

FIG. 5C is a plan view schematic of assembly of light emitting devices 900 in FIG. 5A. The dimension P1 is the pitch between light emitting devices 600 and 700. For small light emitting devices in small displays, the pitch P1 may be 50 microns, 25 microns, or even smaller. For comparison, the pitch between light emitting devices in a large flat panel display, such as that for viewing television images, may be 100 microns or more. Relative to the cylinder-shaped DBRs shown in FIG. 4, the square-shaped DBRs shown in FIG. 5B may be advantageous to obtain a tight pitch (small P1 value) but disadvantageous to luminous efficiency due to more internal reflections before light reaches the viewer.

Figure 6:
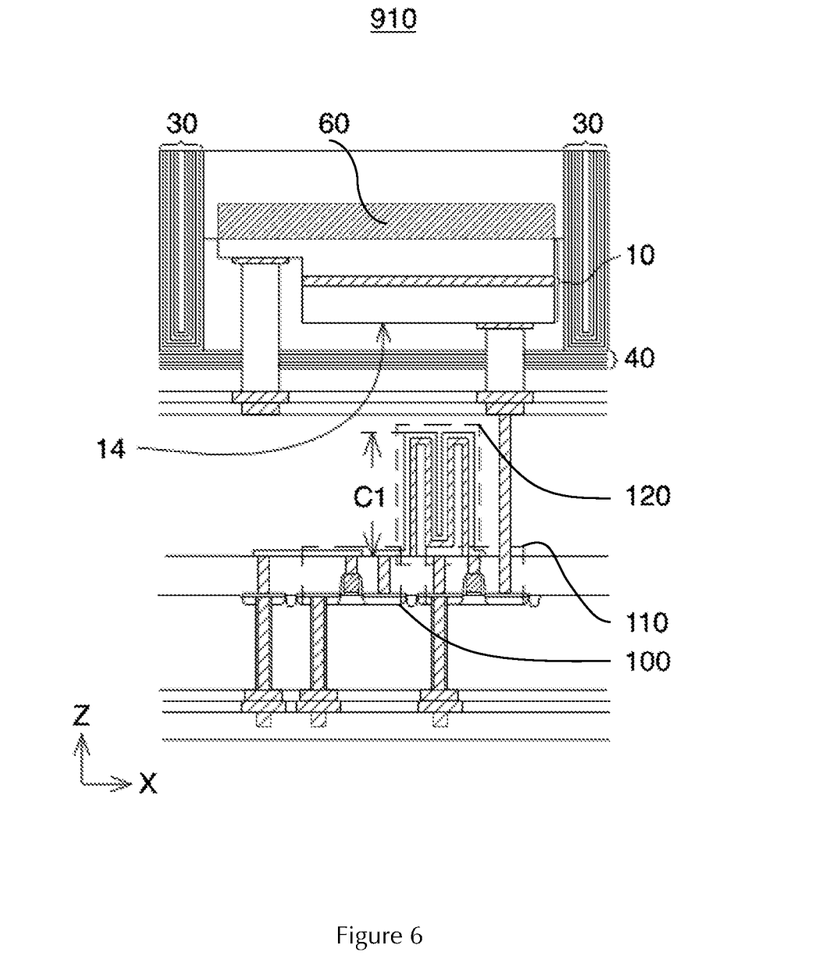
FIG. 6 schematically illustrates a cross-sectional schematic of an embodiment of a light emitting device with control devices underlying the LED.

FIG. 6 is a cross-sectional schematic of another embodiment of a light emitting device. FIG. 6 shows light emitting device 910 with LED 10, W-CL 60, first DBR 30, and second DBR 40. Light emitting device 910 also comprises control devices that turn LED 10 on and off, and these control devices underlie LED 10, as disclosed in Non-Provisional Application II, FIG. 6. By placing all of the control devices underneath LED 10, a tighter pitch amongst devices arranged in a two dimensional array can be obtained. These control devices comprise a first transistor 100, a second transistor 110, and a capacitor 120. First transistor 100 and second transistor 110 comprise single crystal semiconductor. The use of single crystal semiconductor takes advantage of the high carrier mobility in such materials relative to polycrystalline or amorphous semiconductor materials. A high carrier mobility allows the overall size of the transistor to be smaller than for low carrier mobility. The longest dimension C1 of capacitor 120 is substantially orthogonal to LED bottom surface 14.

The above detailed description is provided to illustrate specific embodiments of the present invention and is not intended to be limiting. Numerous variations and modifications of within the scope of the present invention are possible. The present invention is set forth in the accompanying claims.

What is claimed is:

1. A light emitting device comprising:
a light emitting diode (LED) having an LED top surface, an LED bottom surface, and a plurality of LED sidewalls, wherein the plurality of LED sidewalls are substantially orthogonal to the LED top and bottom surfaces, and wherein each LED sidewall is contiguous with at least the LED top surface or the LED bottom surface;
a first distributed Bragg reflector (DBR) having a first DBR first surface and a first DBR second surface, wherein the first DBR first surface and first DBR second surface are substantially parallel to the plurality of LED sidewalls;
a dielectric layer disposed between the LED and the first DBR; and
a first transistor, a second transistor, and a capacitor, wherein the LED overlies the first transistor, the second transistor, and capacitor, wherein the first transistor and second transistor comprise a single crystal semiconductor, and wherein the longest dimension of the capacitor is substantially orthogonal to the LED bottom surface.

2. The light emitting device of claim 1, wherein the LED comprises gallium nitride, indium gallium nitride, indium arsenide, aluminum gallium arsenide, gallium arsenide, gallium phosphide, gallium arsenide phosphide, aluminum indium gallium phosphide, gallium arsenide nitride, aluminum indium arsenide, aluminum antimonide, indium phosphide, indium antimonide, or indium gallium arsenide phosphide, and combinations thereof.

3. The light emitting device of claim 1, further comprising a wavelength-converting layer (W-CL) overlying the LED, wherein the W-CL comprises a W-CL top surface, a W-CL bottom surface, and W-CL sidewalls, and wherein the W-CL sidewalls are substantially parallel to the first DBR first surface and first DBR second surface.

4. The light emitting device of claim 3, wherein the W-CL comprises quantum dots or quantum wells.

5. The light emitting device of claim 1, further comprising a second DBR underlying the LED, the second DBR having a second DBR first surface and a second DBR second surface that are substantially parallel to the LIED bottom surface.

6. The light emitting device of claim 1 wherein the first DBR first surface is a cylinder.

7. An assembly of light emitting devices comprising:
a plurality of light emitting devices, each light emitting device comprising:
(a) a light emitting diode (LED) having an LED top surface, an LED bottom surface, and a plurality of LED sidewalls, wherein the plurality of LED sidewalls are substantially orthogonal to the LED top surface and LED bottom surface, and wherein each LED sidewall is contiguous with at least the LED top surface or the LED bottom surface;
(b) a distributed Bragg reflector (DBR) having a DBR first surface and a DBR second surface, wherein the DBR first surface and DBR second surface are substantially parallel to the plurality of LED sidewalls LED;
(c) a dielectric layer disposed between the LED and the DBR; and
(d) a first transistor, a second transistor, and a capacitor, wherein the LED overlies the first transistor, the second transistor, and capacitor, wherein the first transistor and second transistor comprise a single crystal semiconductor, and wherein the longest dimension of the capacitor is substantially orthogonal to the LED bottom surface; and
a plurality of wavelength-converting layers (W-CLs), wherein the plurality of W-CLs comprises at least a first W-CL and a second W-CL.

8. The assembly of light emitting devices of claim 7 wherein the LED comprises gallium nitride, indium gallium nitride, indium arsenide, aluminum gallium arsenide, gallium arsenide, gallium phosphide, gallium arsenide phosphide, aluminum indium gallium phosphide, gallium arsenide nitride, aluminum indium arsenide, aluminum antimonide, indium phosphide, indium antimonide, or indium gallium arsenide phosphide, and combinations thereof.

9. The assembly of light emitting devices of claim 7 wherein the first W-CL emits light with a dominant wavelength between 500 and 550 nm and a second W-CL emits light with a dominant wavelength between 610 and 730 nm.

10. The assembly of light emitting devices of claim 7 wherein the plurality of W-CLs comprises quantum dots or quantum wells.

11. The assembly of light emitting devices of claim 7 wherein the DBR first surface is a cylinder.

12. The assembly of light emitting devices of claim 7 wherein the pitch between adjacent light emitting devices is 50 microns or less.

13. The assembly of light emitting devices of claim 7 wherein the pitch between adjacent light emitting devices is 25 microns or less.

* * * * *